US010403591B2

(12) United States Patent
Gandhi

(10) Patent No.: US 10,403,591 B2
(45) Date of Patent: Sep. 3, 2019

(54) CHIP PACKAGE ASSEMBLY WITH ENHANCED INTERCONNECTS AND METHOD FOR FABRICATING THE SAME

(71) Applicant: Xilinx, Inc., San Jose, CA (US)

(72) Inventor: Jaspreet Singh Gandhi, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/798,748

(22) Filed: Oct. 31, 2017

(65) Prior Publication Data

US 2019/0131265 A1 May 2, 2019

(51) Int. Cl.

| | |
|---|---|
| ***H01L 23/48*** | (2006.01) |
| ***H01L 21/00*** | (2006.01) |
| ***H01L 23/00*** | (2006.01) |
| ***H01L 23/498*** | (2006.01) |
| ***H01L 21/48*** | (2006.01) |

(52) U.S. Cl.

CPC .......... *H01L 24/16* (2013.01); *H01L 21/4853* (2013.01); *H01L 23/49816* (2013.01); *H01L 23/49872* (2013.01); *H01L 24/05* (2013.01); *H01L 24/11* (2013.01); *H01L 24/81* (2013.01); *H01L 24/03* (2013.01); *H01L 2224/03001* (2013.01); *H01L 2224/0401* (2013.01); *H01L 2224/05073* (2013.01); *H01L 2224/05573* (2013.01); *H01L 2224/11001* (2013.01); *H01L 2224/13017* (2013.01); *H01L 2224/1357* (2013.01); *H01L 2224/13082* (2013.01); *H01L 2224/13647* (2013.01); *H01L 2224/16238* (2013.01); *H01L 2224/81193* (2013.01); *H01L 2224/81815* (2013.01); *H01L 2924/0561* (2013.01); *H01L 2924/14* (2013.01)

(58) Field of Classification Search

CPC . H01L 24/16; H01L 23/3114; H01L 23/3128; H01L 23/481; H01L 24/05; H01L 24/11; H01L 24/13; H01L 24/81

See application file for complete search history.

(56) References Cited

U.S. PATENT DOCUMENTS

| | | | | |
|---|---|---|---|---|
| 8,749,065 B2 * | 6/2014 | Kouno | .................... | H01L 24/03 257/750 |
| 8,970,034 B2 * | 3/2015 | Gandhi | ............... | H01L 23/3142 257/737 |
| 9,034,769 B2 | 5/2015 | Bossler et al. | | |

(Continued)

FOREIGN PATENT DOCUMENTS

| | | |
|---|---|---|
| JP | H11224981 | 8/1999 |

*Primary Examiner* — Alonzo Chambliss
(74) *Attorney, Agent, or Firm* — Keith Taboada

(57) ABSTRACT

An integrated circuit interconnects are described herein that are suitable for forming integrated circuit chip packages. In one example, an integrated circuit interconnect is provided that includes a first substrate containing first circuitry, a first contact pad, a first pillar, a first pillar protection layer, a second substrate containing second circuitry, and a solder ball disposed on the first pillar and electrically and mechanically coupling the first substrate to the second substrate. The first contact pad is disposed on the first substrate and coupled to the first circuitry. The first pillar electrically disposed over the first contact pad. The first pillar protection layer is hydrophobic to solder and is disposed on a side surface of the first pillar.

20 Claims, 6 Drawing Sheets

(56) References Cited

U.S. PATENT DOCUMENTS

| | | | | |
|---|---|---|---|---|
| 9,464,945 | B2 | 10/2016 | Kim et al. | |
| 9,735,123 | B2* | 8/2017 | Lee | H01L 24/13 |
| 2003/0116439 | A1 | 6/2003 | Seo et al. | |
| 2004/0094842 | A1* | 5/2004 | Jimarez | B23K 1/0016 257/772 |
| 2010/0300743 | A1* | 12/2010 | Bchir | H01L 23/49811 174/267 |
| 2011/0256711 | A1* | 10/2011 | Borthakur | H01L 21/76846 438/637 |
| 2011/0285011 | A1* | 11/2011 | Hwang | H01L 24/11 257/737 |
| 2013/0299965 | A1* | 11/2013 | Gandhi | H01L 23/3142 257/737 |
| 2015/0061118 | A1* | 3/2015 | Chen | H01L 24/16 257/737 |
| 2015/0325546 | A1* | 11/2015 | Hwang | H01L 21/76885 257/737 |
| 2015/0371962 | A1 | 12/2015 | Akamatsu | |

* cited by examiner

CHIP PACKAGE ASSEMBLY WITH ENHANCED INTERCONNECTS AND METHOD FOR FABRICATING THE SAME

BACKGROUND OF THE INVENTION

Field of the Invention

Implementations described herein generally relate to chip packaging, and in particular, to solder bump structures for a semiconductor device and methods of fabricating the same.

Description of the Related Art

An increasing demand for electronic equipment that is smaller, lighter, and more compact has resulted in a concomitant demand for semiconductor packages that have smaller outlines and mounting areas or "footprints." One response to this demand has been the development of the "flip-chip" method of attachment and connection of semiconductor chips or "dice" to substrates (e.g., PCBs or lead-frames). Flip-chip mounting involves the formation of bumped contacts (e.g., solder balls) on the active surface of the die, then inverting or "flipping" the die upside down and reflowing the bumped contacts (i.e., heating the bumped contacts to the melting point) to form solder joints fusing the bumped contacts to the corresponding pads on the substrate.

In flip-chip mounting and connection methods, thermo-mechanical reliability is becoming an increasing concern of the electronics industry. Notably, the reliability of the integrated circuit interconnects, e.g., solder joints, is one of the most critical issues for successful application of such mounting and connection methods. However, solder joints formed using known methods are prone to necking, which may lead to cracking of the solder joint. Forming a robust solder connections between interposers and dies utilized in semiconductor packages is particularly challenging at such small pitches due to the differences in thermal expansion which present an undesirably high risk for cracking at high-stress points due to thermal stress cycling.

Therefore, there is a need for improved integrated circuit interconnects and methods of forming improved solder joints for an integrated circuit.

SUMMARY OF THE INVENTION

An integrated circuit interconnects are described herein that are suitable for forming integrated circuit chip packages, along with method for forming the same. In one example, an integrated circuit interconnect is provided that includes a first substrate containing first circuitry, a first contact pad, a first pillar, a first pillar protection layer, a second substrate containing second circuitry, and a solder ball disposed on the first pillar and electrically and mechanically coupling the first substrate to the second substrate. The first contact pad is disposed on the first substrate and coupled to the first circuitry. The first pillar electrically disposed over the first contact pad. The first pillar protection layer is hydrophobic to solder and is disposed on a side surface of the first pillar.

In another example, an integrated circuit interconnect includes an IC die, an interposer, a conductive pillar extending from the interposer, and a solder ball disposed on the pillar and electrically and mechanically coupling the IC die to the interposer. A pillar protection layer is disposed on and covers on a side surface of the conductive pillar. The pillar protection layer is made of a material that is hydrophobic to solder.

In another example, a method for forming an interconnect of an integrated circuit package is provided. The method includes depositing a solder ball on a pillar coupled to first circuitry formed in a first substrate, exposing the solder ball and the pillar to a sulfur containing environment to form a pillar protection layer that is hydrophobic to solder on a side surface of the pillar, attaching the first substrate to a second substrate, and reflowing the solder ball to mechanically and electrically connect the first substrate to the second substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Embodiments of the disclosed technology generally provide a chip package having an improved solder interconnect formed between substrates of the chip package, and methods for forming the same. The chip package includes at least one integrated circuit (IC) die. The substrates of the chip package include the die, a package substrate on which the die is mounted, and optionally an interposer disposed between the package substrate and the die. In the description below, the improved solder interconnect is illustrated between an interposer and an IC die. However, the improved solder interconnect may also be utilized on solder connects coupling an IC die to a package substrate, for coupling an interposer to a package substrate, or for other solder connections. In particular, solder interconnects described herein are less prone to necking and cracking due to a solder wicking resistant coating (e.g., pillar protection layer) formed on the conductive pillars that resists solder wicking onto the pillar. Less wicking results on more solder volume being retained within the solder ball, making a more robust and crack resistance electrical and mechanical connection. Additionally, the process of forming the pillar protection layer may be performed in a manner that advantageously forms a solder ball protection layer on the solder ball. The solder ball protection layer protects the solder ball from oxidation, and is readily removed during the reflow process.

The pillar protection layer makes the novel IC interconnect less prone to intermetallic (IMC) brittleness associated with reduced solder volume. Thus, the inventive IC interconnect provides more robust and reliable signal transmission and better device performance over a wider range of operating conditions, with less expense and manufacturing complexity.

Figure 1:
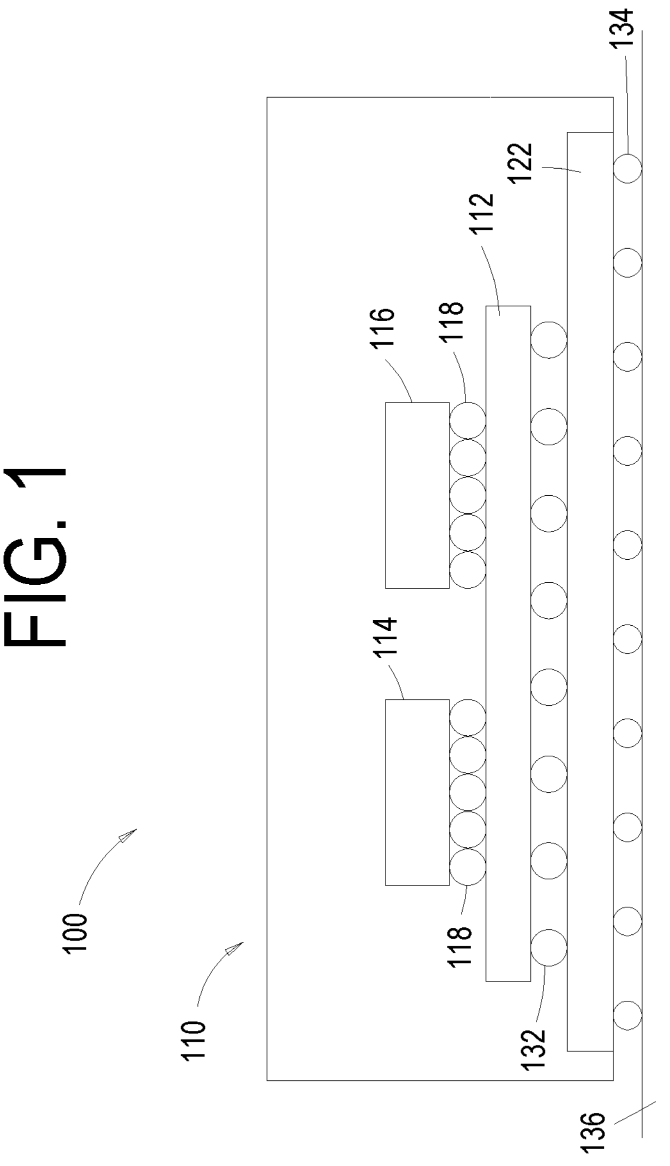
FIG. 1 is a front schematic view of an electronic device having an integrated chip package including at least one integrated circuit die coupled by a solder interconnect an interposer of the chip package.

Turning now to FIG. 1, an exemplary electronic device 100 is schematically illustrated. The electronic device 100 includes an integrated circuit chip package 110 coupled to a printed circuit board (PCB) 136. The electronic device 100 may be a computer, tablet, cell phone, smart phone, consumer appliance, control system, automated teller machine, programmable logic controller, printer, copier, digital camera, television, monitor, stereo, radio, radar, or other device incorporating the chip package 110.

The chip package 110 includes at least one integrated circuit (IC) die. In FIG. 1, a plurality of IC dice 114, 116 are shown connected by an interposer 112 to a package substrate 122. The chip package 110 may also have an overmold (not shown) covering the IC dice 114, 116. The interposer 112 may be a through-substrate-via (TSV) or a substrate-less interposer as commonly known in the art. The interposer 112 includes circuitry for electrically connecting the dice 114, 116 to circuitry of the package substrate 122. The circuitry of the interposer 112 may optionally include active or passive circuit elements.

The IC dice 114, 116 are mounted to one or more surfaces of the interposer 112. The IC dice 114, 116 may be programmable logic devices, such as field programmable gate arrays (FPGA), memory devices, optical devices, processors or other IC logic structures. Optical devices include photodetectors, lasers, optical sources, and the like. In the embodiment depicted in FIG. 1, the IC dice 114, 116 are mounted to a top surface of the interposer 112 by a plurality of solder interconnects 118. The solder interconnects 118 electrically connect the circuitry of each IC die 114, 116 to the circuitry of the interposer 112. The solder interconnects 118 are further discussed below with reference to FIG. 2.

A plurality of solder interconnects 132 are also utilized to form the electrical and mechanically connections between the circuitry of the interposer 112 and the circuitry of the package substrate 122. The solder interconnects 132 may be formed using solder balls, also known as "package bumps" or "C4 bumps," or may be formed as described with reference to the solder interconnects 118 below. The package substrate 122 may be mounted and connected to the PCB 136 utilizing solder connections, wire bonding or other suitable technique. In the embodiment depicted in FIG. 1, the package substrate 122 is mounted to the PCB 136 using a plurality of solder balls 134.

The circuitry of the interposer 112 connects the solder interconnects 118 to selective solder interconnects 132, and hence, connects selective circuitry of each IC die 114, 116 to the package substrate 122, to enable communication of the dice 114, 116 with the PCB 136 after the chip package 110 is mounted within the electronic device 100.

As discussed above, the solder interconnects 118 are configured to mechanically and electrically connect the interposer 112 with the IC die 114. One example of an exemplary solder interconnect 132 is further detailed below with reference to FIG. 2. The other solder interconnect 132 coupling the interposer 112 to the package substrate 122 may be similarly constructed.

Figure 2:
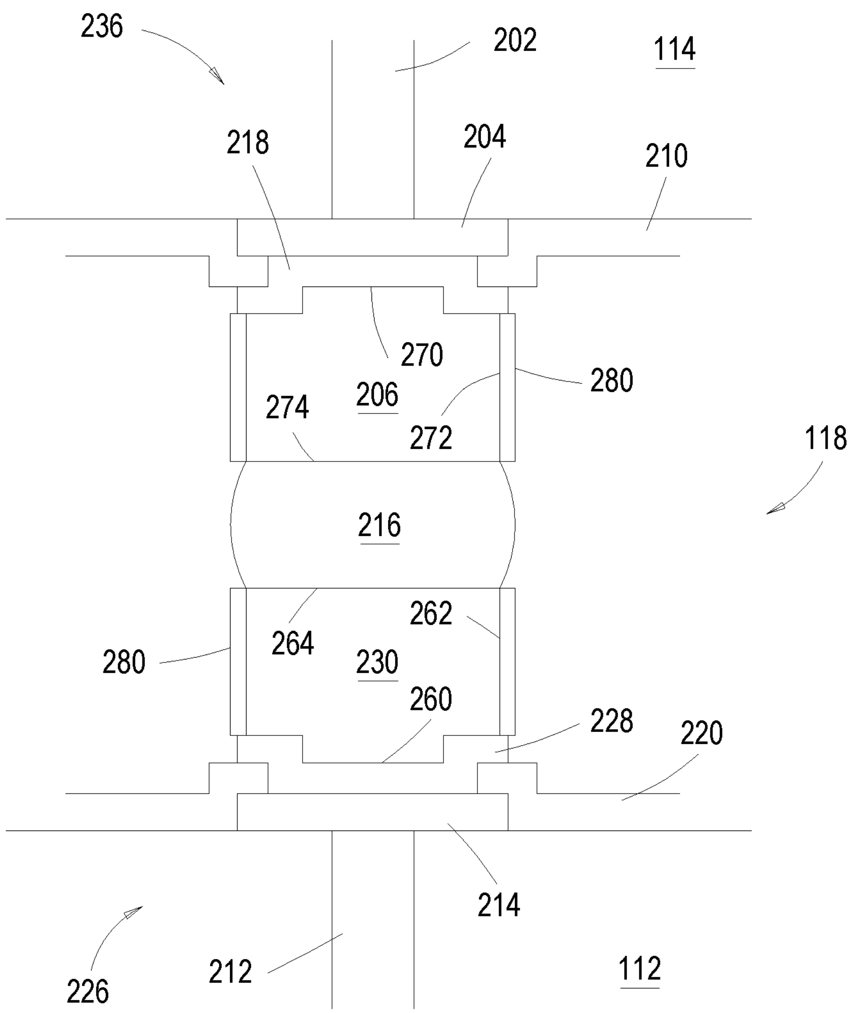
FIG. 2 is a partial sectional one embodiment of the solder interconnect coupling the interposer to the die of the chip package of FIG. 1.

FIG. 2 is a partial sectional view of the chip package 110 illustrating one of the solder interconnects 118 coupling two adjacent substrates. In the example depicted in FIG. 2, the first substrate is illustrated as the IC die 114 and the second substrate is illustrated as the interposer 112. The IC die 116 may be coupled by other solder interconnects 118 to the interposer 112 in the same manner. The solder interconnect 118 is configured to provide robust and reliable high-speed signal transmission between circuitry 202 of the IC die 114 and circuitry 212 of the interposer 112.

The die 114 has a die body 236 through which the circuitry 202 is formed. The circuitry 202 is formed using the multiple metal and dielectric layers comprising the body 236 of the die 114. As discussed above, the circuitry 202 of the die 114 may be configured as logic devices, such as field programmable gate arrays (FPGA), memory devices, optical devices, processors or other IC logic structures The circuitry 202 is coupled to the solder interconnects 118 disposed on a bottom side of the die 114, as shown in FIG. 1. The circuitry 202 terminates at a contact pad 204 formed on the bottom side of the die 114. The contact pad 204 may be formed from copper or other suitable conductor.

An optional passivation layer (not shown) may also be is disposed over the bottom side of the die 114. The passivation layer includes an opening through which the contact pad 204 is exposed. The passivation layer may be layer of a silicon nitride or other suitable material. The silicon nitride layer may be deposited using a chemical vapor deposition (CVD) process.

A solder mask 210 disposed on the bottom side of the die 114. The solder mask 210 is deposited on the passivation layer when the passivation layer is present. The solder mask 210 includes an opening through which the contact pad 204 is exposed. The solder mask 210 may be formed from one or more layers of photoimageable material. Suitable photoimageable materials for forming the solder mask 210 include acrylic or polyimide plastic photoimageable materials, liquid photoimageable materials, dry photoimageable films, or alternatively, an epoxy resin that is silk screened or spin-coated on the bottom side of the die 114. The photoimageable material comprising the solder mask 210 may be patterned using photolithography techniques.

Optionally, an underbump metal (UBM) layer 218 may be formed on the contact pad 204 through the opening formed in the solder mask 210. The UBM layer 218 may include one or more of an adhesion layer, a barrier layer and a conductive seed layer. Adhesion and barrier materials suitable for forming the UBM layer 218 include but are not limited to titanium, titanium tungsten (TiW), nickel (Ni), nickel vanadium (NiV), and/or chromium (Cr). In one example, the UBM layer 218 is configured to enhances the adhesion and signal transfer between the contact pad 204 and a conductive pillar 206 formed thereon. In some implementations, the UBM layer 218 is or includes a conductive seed layer. For example, the UBM layer 218 may include conductive seed layer formed over an adhesion/barrier layer prior to deposition of the conductive pillar 206. Exemplary conductive seed layer materials include copper and titanium. Exemplary processes for deposition of the conductive seed layer materials include electrochemical plating (ECP) processes, electroless plating processes and PVD processes.

The conductive pillar 206 is formed on the UBM layer 218, or directly on the contact pad 204 through the opening in the solder mask 210 in embodiments not having the optional UBM layer 218. The conductive pillar 206 may be fabricated from copper or other suitable conductive material. The conductive pillar 206 includes a bottom surface 270, a side surface 272 and a top surface 274. In the example depicted in FIG. 2, the bottom surface 270 of the pillar 206 is deposited directly on the UBM layer 218. The top surface 274 may include an optional plating layer (not shown). The optional plating layer may be formed from at least one of copper and nickel, among other materials.

A pillar protection layer 280 is disposed on the side surface 272 of the conductive pillar 206. In the example of FIG. 2, the pillar protection layer 280 covers the entire side surface 272 of the conductive pillar 206. The pillar protection layer 280 is formed from an inorganic passivation material that is hydrophobic to solder. For example, solder may form a contact angle with the surface of the hydrophobic passivation material of the pillar protection layer 280 of between 90 and 180 degrees. In one example, the pillar protection layer 280 is formed from a copper sulfide. Copper sulfide generally has the formula $Cu_xS_y$, where X and Y are non-negative integers, such as CuS and $CuS_2$, among others. The pillar protection layer 280 is not formed on the bottom and top surfaces 270, 274. Stated differently, the pillar protection layer 280 shown in the example depicted in FIG. 2 is only disposed on the side surface 272, while the bottom and top surfaces 270, 274 are free of the pillar protection layer 280.

As discussed above, the second substrate illustrated in FIG. 2 is the interposer 112. The interposer 112 has an interposer body 226 through which the circuitry 212 is formed. The circuitry 212 is formed using the multiple metal and dielectric layers comprising the body 226 of the interposer 112. A top surface of the body 226 of the interposer 112 is generally formed from a dielectric layer. The circuitry 212 is coupled to the solder interconnects 132 disposed on a bottom side of the interposer 112, as shown in FIG. 1. The circuitry 212 also terminates at a contact pad 214 formed on the top surface of the interposer 112. The contact pad 214 may be formed from copper or other suitable conductor.

Although not shown, an optional passivation layer may be disposed over the contact pad 214 formed on the top surface of the interposer 112. The passivation layer includes an opening through which the contact pad 214 is exposed. The passivation layer may be layer of a silicon nitride or other suitable material, such as described above.

A solder mask 220 is disposed on the passivation layer, when present, or directly on the top surface of the interposer 112 in examples that do not include a passivation layer such as shown in FIG. 2. The solder mask 220 includes an opening through which the contact pad 214 is exposed. The solder mask 220 may be formed as described above.

Optionally, an underbump metal (UBM) layer 228 may be formed on the contact pad 214 through the opening formed in the solder mask 210. The UBM layer 228 may be fabricated as discussed above with reference to the UBM layer 218 discussed above.

The conductive pillar 230 is formed on the UBM layer 228, or directly on the contact pad 214 through the opening in the solder mask 220 in embodiments not having an optional UBM layer. The conductive pillar 230 may be fabricated as discussed above with reference to the conductive pillar 206.

The conductive pillar 230 includes a bottom surface 260, a side surface 262 and a top surface 264. In the example depicted in FIG. 2, the bottom surface 260 of the pillar 230 is deposited directly on the UBM layer 228. The top surface 264 may include an optional plating layer (not shown).

A pillar protection layer 280 is disposed on the side surface 262 of the conductive pillar 230. In one example, the pillar protection layer 280 is formed from a copper sulfide, such as described with reference to the pillar protection layer 280 disposed on the pillar 206 discussed above. The pillar protection layer 280 is not formed on the bottom and top surfaces 260, 264 of the pillar 230. Stated differently, the pillar protection layer 280 shown in the example depicted in FIG. 2 is only disposed on the side surface 262, while the bottom and top surfaces 260, 264 of the pillar 230 are free of the pillar protection layer 280.

A solder ball 216 electrically and mechanically couples the top surface 274 of the conductive pillar 206 extending from the die 114 with the top surface 264 of the conductive pillar 230 extending from the interposer 112. The solder ball 216 and pillars 230 completes the electrical solder interconnect 118 that couples the circuitry 202 of the die 114 to the circuitry 212 of the interposer 112 through the contact pads 204, 214. In one example, the solder ball 216 is composed of a lead-free solder including tin and silver (Sn—Ag) or other suitable material.

During deposition of solder balls 216 and coupling of the pillars 206, 230 by the solder balls 216, the pillar protection layer 280 advantageously prevents wicking of solder from the solder balls 216 on the side surfaces 262, 272 because the material of the pillar protection layer 280 is not wetted by the solder comprising the solder balls 216. The prevention of wicking advantageously maintains the volume of the solder balls 216, thus reducing the probability of necking, voids, cracking and IMC brittleness after reflow. Accordingly, the solder interconnects 118 provide robust electrical and mechanical connections between the dice 114, 116 and interposer 112, thus providing reliable and efficient high speed signal transfer between the pads 204, 214 and circuitry 202, 212 of the chip package 110. Additionally, the interconnects 132 may be similarly formed between the interposer 112 and package substrate 122 of the Chip package 110.

Figure 3A:
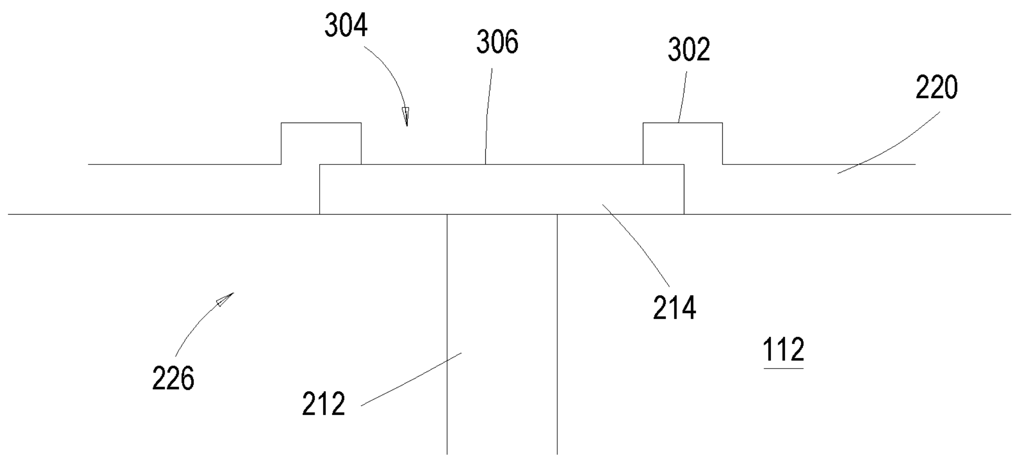
FIGS. 3A-E are sequential views of a chip package during different stages of fabrication.
Figure 3B:
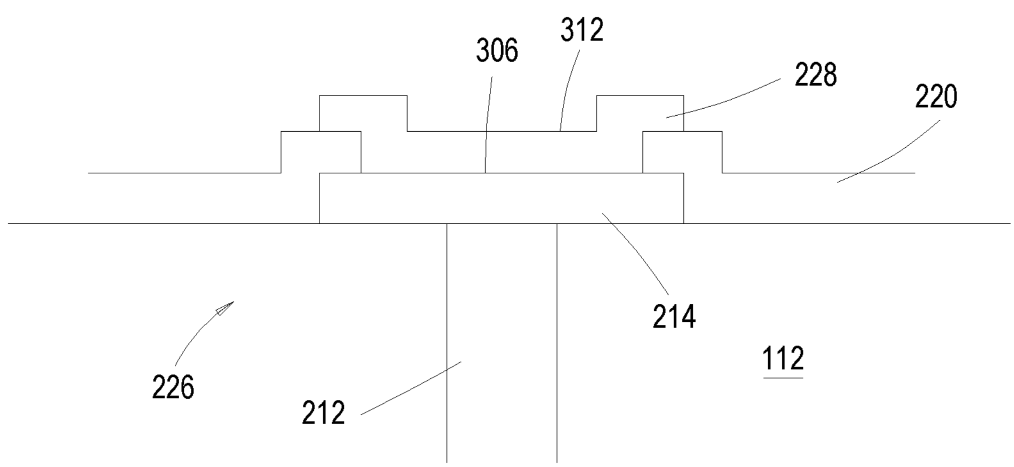
Figure 3C:
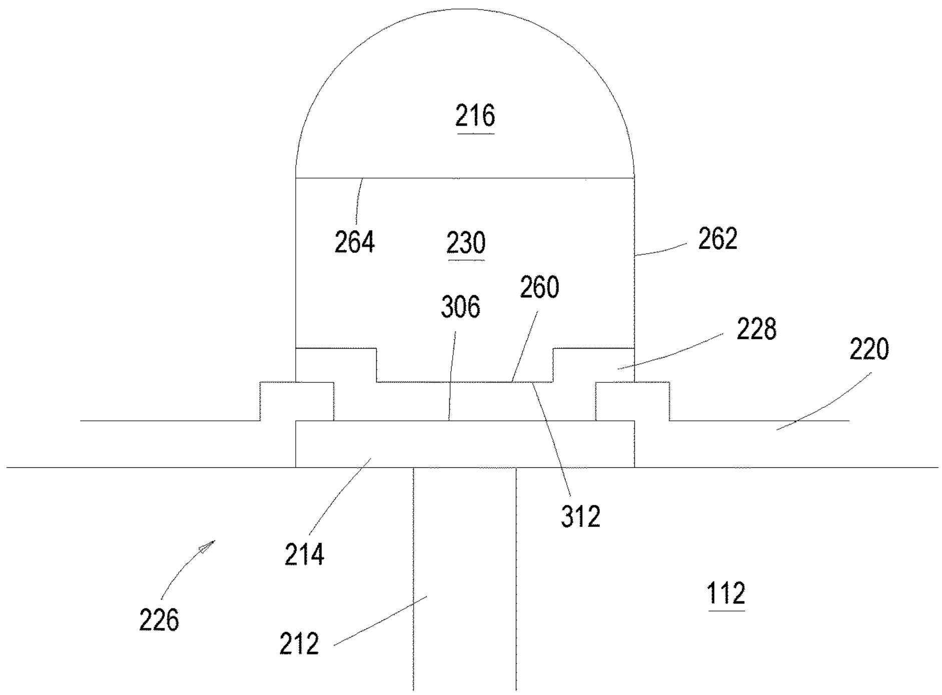
Figure 3D:
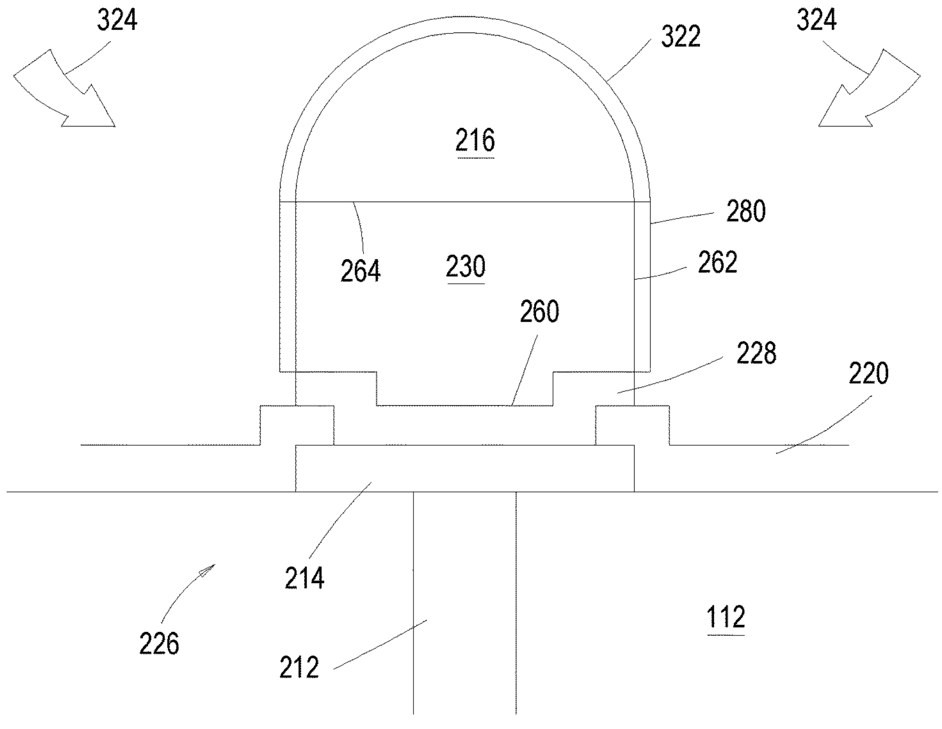
Figure 3E:
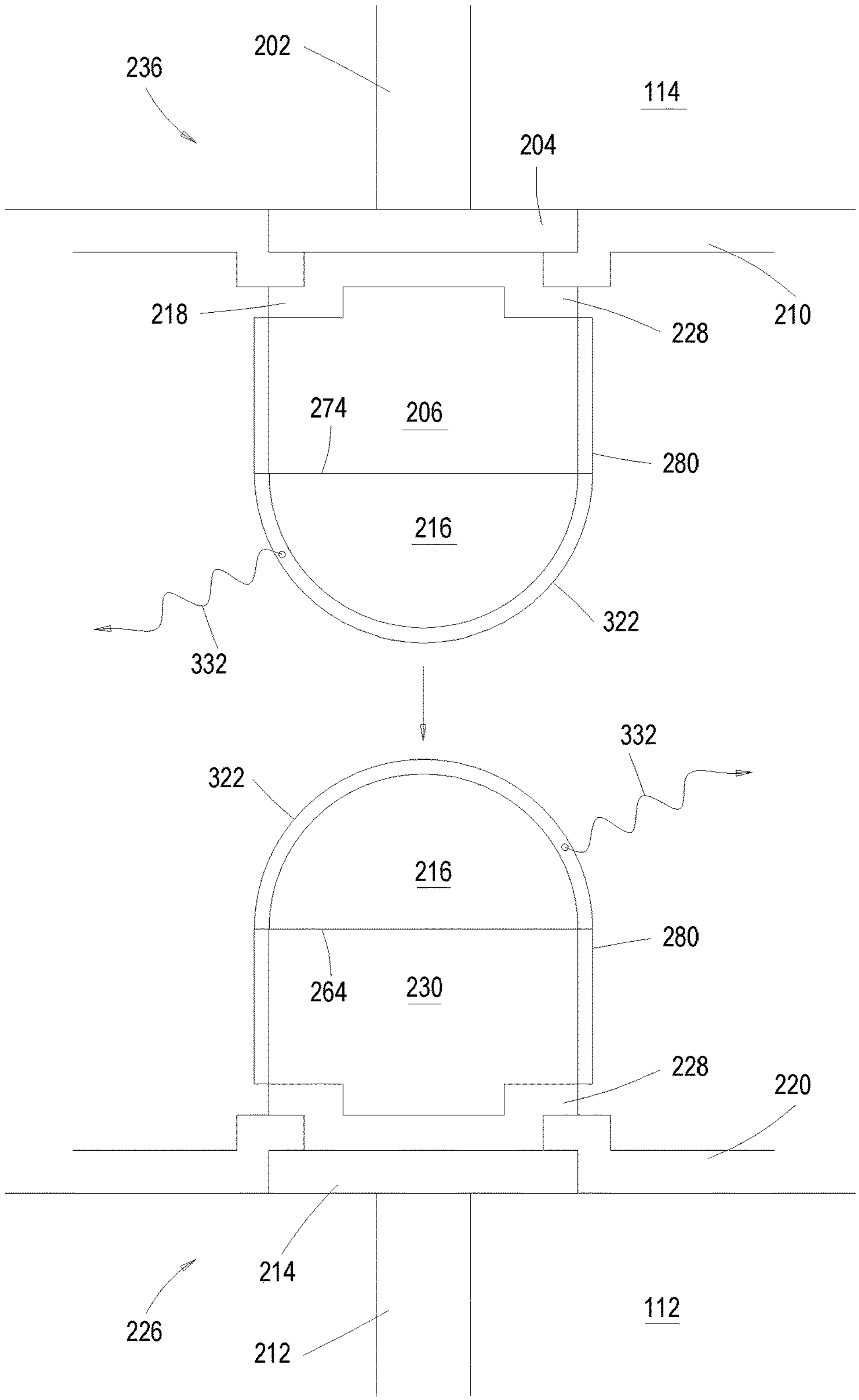
Figure 4:
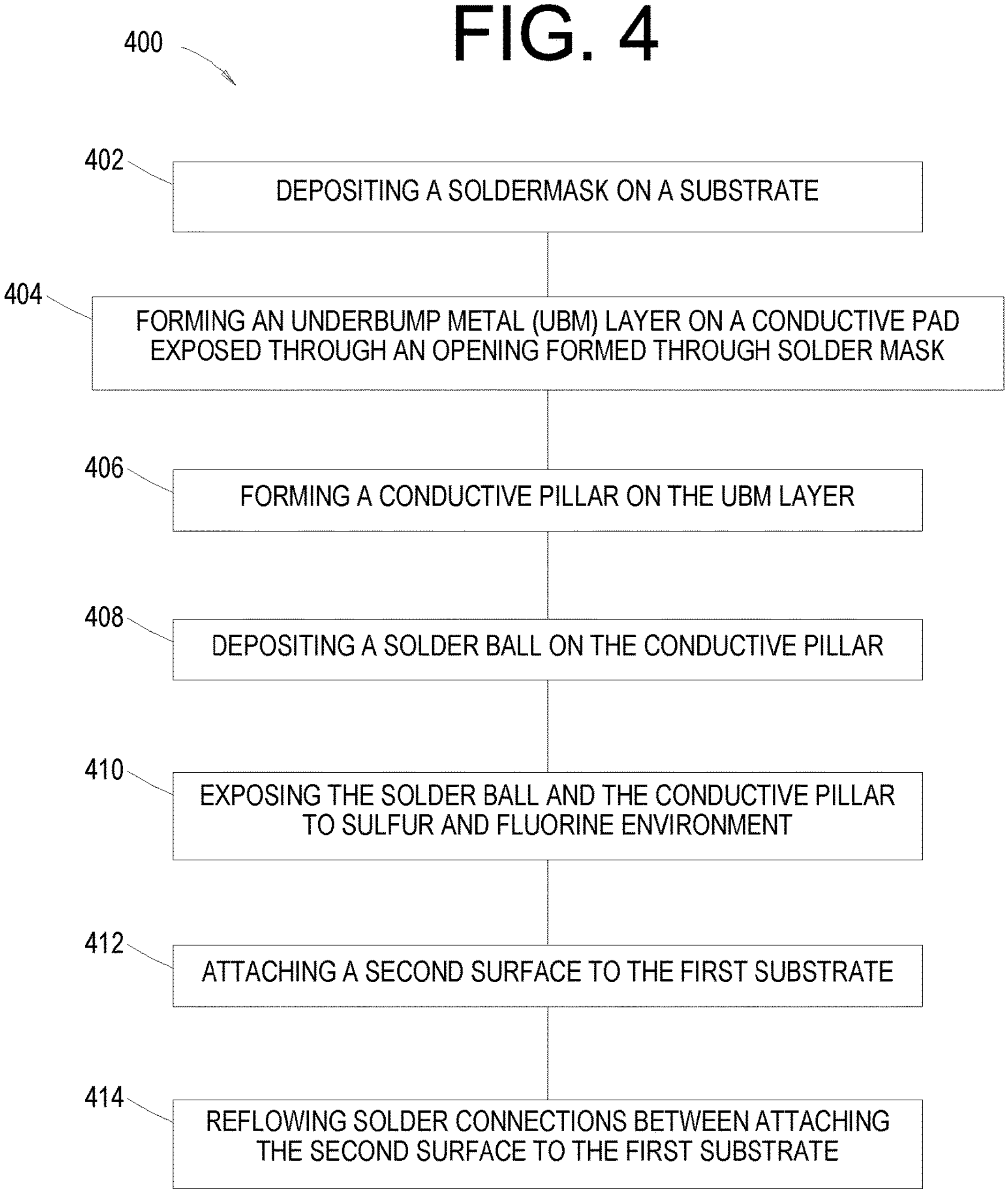
FIG. 4 is a flow diagram of a method for forming a chip package, such as the chip package depicted in FIG. 1 or other chip package incorporating an IC interconnect.

FIG. 4 is a flow diagram of a method 400 for forming a chip package, such as the chip package 110 depicted in FIG. 1 or other chip package incorporating an IC interconnect, such as the solder interconnects 118 and/or solder interconnects 132. FIGS. 3A-E are sequential views of the chip package 110 during different stages of fabrication associated with the method 400. Although the sequence of FIGS. 3A-E illustrate forming an interconnect 118, the interconnects 132 may be formed utilizing the same method 400.

Referring now to FIG. 3A and FIG. 4, the method 400 begins at operation 402 by forming a solder mask on a first substrate. As discussed above, the first substrate may be a die, interposer or package substrate. The solder mask may be a photoimageable materials such as acrylic or polyimide plastic photoimageable materials, liquid photoimageable materials, dry photoimageable films. Alternatively, the solder mask may be an epoxy resin that is silk screened or spin-coated on the first substrate. In the example depicted in FIG. 3A, the solder mask 220 includes an opening 304 through which a portion of a top surface 306 of the conductive contact pad 214 is exposed. The opening 304 may be formed in the photoimageable material comprising the solder mask 220 using photolithography techniques. A portion 302 of the solder mask 220 is disposed on the top surface 306 and bounds the opening 304 so that the side surfaces of the contact pad 214 are completely covered by the solder mask 220.

At operation 404, an optional underbump metal (UBM) layer 228 is formed on the conductive pad 214 exposed through the opening 304 formed through solder mask 220 as shown in FIG. 3B. The UBM layer 228 includes one or more of an adhesion layer, a barrier layer and a conductive seed layer. The UBM layer 228 may be fabricated from one or more layers of titanium, titanium tungsten (TiW), nickel (Ni), nickel vanadium (NiV), chromium (Cr) and copper (Cu). The UBM layer 228 may be deposited by plating, electrochemical ECP plating, electroless plating, PVD or other suitable process.

At operation 406, a conductive pillar 230 is formed on the UBM layer 228 as shown in FIG. 3C. If the UBM layer 228 is not present, the conductive pillar 230 is formed directly on exposed surface 306 of the contact pad 214 exposed through the opening 304 formed in the solder mask 220. The conductive pillar 230 may be fabricated from copper or other suitable conductive material. The conductive material comprising the pillar 230 may be deposited via a plating, PVD or other suitable process. The conductive pillar 230 may optionally include a plating layer. The plating layer may be formed from at least one of copper and nickel, among other materials.

The conductive pillar 230 includes a bottom surface 260 that is formed directly on a surface 312 the UBM layer 228 facing away from the contact pad 214. Alternatively, the bottom surface 260 of the conductive pillar 230 may alternatively be formed directly on the exposed top surface 306 of the contact pad 214 in embodiments that do not include the UBM layer. The side surface 262 of the conductive pillar 230 is substantially free from any coatings, with the exception of naturally occurring oxides.

At operation 408, solder balls 216 are deposited on the conductive pillar 230. In the example illustrated in FIG. 3C, the solder ball 216 is deposited directly on the conductive pillar 230. The solder balls 216 may be deposited by any suitable method.

At operation 410, the solder ball 216 and the conductive pillar 230 are exposed to a sulfur and halogen containing environment. For example as depicted in FIG. 3D, sulfur and halogen in present in the environment interacts with the solder ball 216 and the conductive pillar 230 as shown by arrows 324. The reaction with the sulfur in the environment surrounding the conductive pillar 230 causes the pillar protection layer 280 to form on the conductive pillar 230. Since the bottom side 260 and top side 264 of the conductive pillar 230 are not exposed to sulfur, the pillar protection layer 280 only forms on the side surface 272 of the conductive pillar 230. In one example, sulfur may be provided to the side surface 272 of the conductive pillar 230 in the form of a sulfur containing gas, such as $SF_6$ gas. The sulfur may be in ionic form, which may be obtained by energizing the sulfur containing gas to form a plasma.

Similarly, exposure halogen causes oxygen elements present on the exterior of the solder ball 216 (e.g., SnO) to be replaced with a halogen element, thereby forming a solder ball protection layer 322. Halogen elements used to form the solder ball protection layer 322 include fluorine containing gases, such as $SF_6$. In the example depicted in FIG. 3D, the solder ball protection layer 322 is formed by exposure to fluorine and is comprised of $SnF_2$. The halogen, such as fluorine, may be in ionic form, which may be obtained by energizing the halogen containing gas to form a plasma. Since the solder ball protection layer 322 generally has a lower melting point than the reflow temperature, the solder ball protection layer 322 protects the solder ball 216 from oxidation prior to assembly, will readily dewetting and breaking free from the solder comprising the solder ball 216 during the soldering process at reflow. Advantageously, the solder ball protection layer 322 essentially eliminates the need for post reflow cleaning. In one example, the halogen element may be fluorine. For example, fluorine may be provided in a sulfur and fluorine containing gas, such as $SF_6$. Although the sulfur and halogen elements may be provided separately in time, providing the sulfur and halogen elements at the same time as separate gases are in a single gaseous compound advantageously forms both the pillar protection layer 280 and the solder ball protection layer 322 in a single step, thus reducing manufacturing costs and complexity while enhance the yield and reliability of robust solder interconnects.

At operation 412, a second substrate is attached to the first substrate. In the example depicted in FIG. 3E, the die 114 (e.g., second substrate) is attached to the interposer 112 (e.g., first substrate). The die 114 and interposer 112 are moved towards each other such that the solder balls 216 disposed on each pillar 206, 230 contact each other.

At operation 414, the solder connections attaching the second surface to the first substrate are reflowed. For example, the solder balls 216 disposed on each pillar 206, 230 in contact each other are subjected to a controlled heating process. The reflow process melts the contacting solder balls 216 so that the solder ball protection layer 322 is removed (as shown by arrows 332 in FIG. 3E) and the solder balls 216 unify to form a single solder connection coupling the conductive pillars 206, 230. The unified solder ball 216 establishes a permanent mechanical and electrical solder interconnect 118 between the die 114 and interposer 112, such as illustrated in FIG. 2. The solder balls 216 may be heated during reflow in a reflow oven, under an infrared lamp, or by other suitable method.

Since the pillar protection layer 280 remains on the side surfaces 262, 272 of the pillars 206, 230 during the entire reflow process, the pillar protection layer 280 substantially prevents solder from the solder balls 216 from wicking onto the side surfaces 262, 272 of the pillars 206, 230. Thus, the solder comprising the unified solder ball 216 forming the interconnect 118 illustrated in FIG. 2 has a larger retained solder volume, and is this less susceptible to cracking, voids and IMC brittleness.

The solder interconnect 118 described above is particularly suitable for providing robust solder connections between the dice 114, 116 and the interposer 112. The solder interconnect 118 may also be utilized for providing robust solder connections between the dice 114, 116 and the package substrate 122 when not interposer is present. Additionally, the solder interconnect 132 may also be fabricated as described above with reference to the solder interconnect 118, thus providing robust solder connections between the interposer 112 and the package substrate 122. Advantageously, the solder interconnects 118, 132 are resistant to solder wicking, even during reflow, due to the pillar protection layer 280 formed on the side surface 262, 272 of the pillars 206, 230. Moreover, as the pillar protection layer 280 and the solder ball protection layer 322 may be formed simultaneously, cost and process time may be saved as compared to conventional solder interconnect processes.

The chip package 110, as fabricated using solder interconnects 118, interconnects 132, or other similarly constructed solder interconnect, may be utilized in an electronic device, such as the electronic device 100 described above. The solder interconnects 118, 132 described above advantageously provide robust solder connections between various substrates comprising the Chip package 110, such as dice, interposers and package substrates, thus improving performance, cost and reliable of chip packages fabricated with such interconnects. By reducing the probability of necking, cracking and IMC brittleness, the IC interconnects described above may be readily implemented at small pitches at a minimal cost, thereby advantageously increasing reliability, device yield and performance.

While the foregoing is directed to embodiments of the present invention, other and further embodiments of the invention may be devised without departing from the basic scope thereof, and the scope thereof is determined by the claims that follow.

What is claimed is:

1. An integrated circuit interconnect comprising:
a first substrate containing first circuitry;
a first contact pad disposed on the first substrate and coupled to the first circuitry;
a first pillar electrically disposed over the first contact pad;
a first pillar protection layer disposed on a side surface of the first pillar, the first pillar protection layer being hydrophobic to solder, wherein the first pillar protection layer is copper sulfide;
a second substrate containing second circuitry; and
a solder ball disposed on the first pillar and electrically and mechanically coupling the first substrate to the second substrate.

2. The integrated circuit interconnect of claim 1, wherein the first pillar protection layer comprises:
an inorganic passivation material that is hydrophobic to solder.

3. The integrated circuit interconnect of claim 1, wherein the first pillar protection layer can be expressed as $Cu_xS_y$.

4. The integrated circuit interconnect of claim 1, wherein the first pillar protection layer is at least one of CuS and $CuS_2$.

5. The integrated circuit interconnect of claim 1, wherein the first pillar protection layer is not formed on a bottom surface or a top surface of the first pillar.

6. The integrated circuit interconnect of claim 1, wherein the first substrate is an interposer.

7. The integrated circuit interconnect of claim 6, wherein the second substrate is an IC die.

8. The integrated circuit interconnect of claim 6, wherein the second substrate is a package substrate.

9. The integrated circuit interconnect of claim 1 further comprising:
a second contact pad disposed on the second substrate and coupled to the second circuitry formed in the second substrate;
a second pillar electrically disposed over the second contact pad; and
a second pillar protection layer disposed on a side surface of the second pillar, the second pillar protection layer hydrophobic to solder, wherein the second pillar protection layer is copper sulfide.

10. The integrated circuit interconnect of claim 9, wherein the second pillar protection layer comprises:
an inorganic passivation material that is hydrophobic to solder, wherein the inorganic passivation material is a layer of copper sulfide.

11. An integrated circuit interconnect comprising:
an IC die;
an interposer;
a conductive pillar extending from the interposer;
a solder ball disposed on the pillar and electrically and mechanically coupling the IC die to the interposer; and
a pillar protection layer covering on a side surface of the conductive pillar, the pillar protection layer hydrophobic to solder, wherein the pillar protection layer is copper sulfide.

12. The integrated circuit interconnect of claim 11, wherein the pillar protection layer can be expressed as $Cu_xS_y$.

13. A method for forming an interconnect of an integrated circuit package, the method comprising:
depositing a solder ball on a pillar coupled to first circuitry formed in a first substrate;
exposing the solder ball and the pillar to a sulfur containing environment to form a copper sulfide pillar protection layer that is hydrophobic to solder on a side surface of the pillar;
attaching the first substrate to a second substrate; and
reflowing the solder ball to mechanically and electrically connect the first substrate to the second substrate.

14. The method of claim 13 further comprising:
exposing the solder ball and the pillar to a halogen containing environment to form a solder ball protection layer on an exposed exterior of the solder ball.

15. The method of claim 14, wherein exposing the solder ball and the pillar to a halogen containing environment and a sulfur containing environment occurs simultaneously.

16. The method of claim 15, wherein exposing the solder ball and the pillar to a halogen containing environment and a sulfur containing environment comprises:
exposing the solder ball and the pillar to a sulfur and fluorine containing gas.

17. The method of claim 13, wherein reflowing the solder ball removes the solder ball protection layer without removing the pillar protection layer.

18. The method of claim 13, wherein the copper sulfide pillar protection layer can be expressed as $Cu_xS_y$.

19. The integrated circuit interconnect of claim 11, wherein the first pillar protection layer can be expressed as $Cu_xS_y$.

20. The integrated circuit interconnect of claim 11, wherein the first pillar protection layer is at least one of CuS and $CuS_2$.

* * * * *